(12) United States Patent
Hu et al.

(10) Patent No.: US 11,101,346 B2
(45) Date of Patent: Aug. 24, 2021

(54) EDGE TERMINATION DESIGNS FOR SEMICONDUCTOR POWER DEVICES

(71) Applicants: Jun Hu, San Bruno, CA (US); Zhiyun Luo, San Jose, CA (US); Fei Wang, San Jose, CA (US)

(72) Inventors: Jun Hu, San Bruno, CA (US); Zhiyun Luo, San Jose, CA (US); Fei Wang, San Jose, CA (US)

(73) Assignee: HUNTECH SEMICONDUCTOR (SHANGHAI) CO. LTD, Shanghai (CN)

( * ) Notice: Subject to any disclaimer, the term of this patent is extended or adjusted under 35 U.S.C. 154(b) by 0 days.

(21) Appl. No.: 15/076,553

(22) Filed: Mar. 21, 2016

(65) Prior Publication Data
US 2019/0206986 A1    Jul. 4, 2019

(51) Int. Cl.
  *H01L 29/06* (2006.01)
  *H01L 29/78* (2006.01)
  *H01L 21/266* (2006.01)
  *H01L 21/761* (2006.01)

(52) U.S. Cl.
  CPC ........ *H01L 29/0623* (2013.01); *H01L 21/266* (2013.01); *H01L 21/761* (2013.01); *H01L 29/7811* (2013.01); *H01L 29/7823* (2013.01)

(58) Field of Classification Search
  None
  See application file for complete search history.

(56) References Cited

U.S. PATENT DOCUMENTS

2012/0153386 A1* 6/2012 Hirler ................ H01L 29/0653
                                                                 257/334
2015/0162410 A1* 6/2015 Padmanabhan ....... H01L 29/407
                                                                 257/488

* cited by examiner

*Primary Examiner* — Erik Kielin
(74) *Attorney, Agent, or Firm* — Bo-In Lin

(57) ABSTRACT

This invention discloses a semiconductor power device formed on a semiconductor substrate comprises an active cell area and a termination area disposed near edges of the semiconductor substrate. The termination area comprises a plurality of duplicated units wherein each unit includes at least two trenches filled with a conductive trench material having a mesa area between adjacent trenches wherein the trenches and the mesa areas within each of the duplicated units are electrically shunt together. In the termination area each of the trenches in the duplicated units has a buried guard ring dopant region disposed below a bottom surface of the trenches.

12 Claims, 10 Drawing Sheets

EDGE TERMINATION DESIGNS FOR SEMICONDUCTOR POWER DEVICES

FIELD OF THE INVENTION

The invention relates generally to semiconductor power devices. More particularly, this invention relates to new configurations and methods for manufacturing improved power device with new edge termination structures implemented with trenches and buried guard rings wherein the termination area comprises multiple duplicated units each including two or more than two trenches electrically linked together with the mesa area by metal pad and trench contacts.

2. DESCRIPTION OF THE RELATED ART

Conventional technologies to configure and manufacture semiconductor power devices operating at the higher voltage are still confronted with difficulties and limitations. Particularly, the configuration and designs of the termination area are critical due to the limitation of breakdown voltage and crowding of electrical fields that can often leads to device vulnerability and causes unreliable device operations. For these reasons, the configurations and designs of termination are critically important especially for devices that require the termination area to sustain a higher breakdown voltage.

Furthermore, in order to improve the performances of a semiconductor power device, it is required to improve the unclamped inductive switch (UIS) capability. Additionally, a durable semiconductor power device requires that the device has high operational and integrity reliability and can achieve high degree of device robustness. For these reasons, it is necessary to design the termination area with improved characteristics of electrical field spreading across the entire termination area to prevent local electrical field crowding in any particular locations and near the top surface of the termination area.

Different designs of the termination area have been disclosed. In U.S. Pat. No. 8,680,613, a termination design for high voltage device is disclosed and illustrated in FIG. 1A. The termination is separated into several regions, 321a, 321b and 321c. In region 321a the trench polysilicon is shunt to the mesa on the left and in regions 321b, the trench polysilicon is shunt to the right. The mesa area between 321a and 322b is floating. Upon detail examination, it is obvious that the electrical field is very high at the sidewall interface between the shield oxide and the silicon mesa. In addition to that, the minimum mesa width is required to be greater than the contact critical dimension (CD). Furthermore, the shield oxide layer is required to have a greater thickness due to the high electrical field impose on the shield oxide layer.

U.S. Pat. No. 8,803,251 discloses a termination design for high voltage (HV) device as that shown in FIG. 2A. However, the device configurations as shown may have reliability concerns. Specifically, the polysilicon in the trenches of FIG. 2B is floating and that may suffer unstable breakdown voltage and leads to poor device reliability. The trench polysilicon in FIG. 2B is connected to adjacent mesa on one side and the electrical field is very high at the sidewall interface between the shield oxide and the silicon mesa immediately adjacent to the trenches. For this reason, a minimum mesa width is again required and that would cause the mesa width to be greater than the contact CD in the mesa between the trenches. Furthermore, a thicker layer thickness of the shield oxide would also be required to sustain a high electrical field.

For the above reasons, there is a need to provide new device configurations and new manufacturing methods for the semiconductor power devices reduce the electrical field on the shield oxide layer on trench sidewalls and also eliminate the minimum mesa width requirement and in the meantime increasing the device reliability and robustness of the power device such that the above discussed difficulties and limitations can be resolved.

SUMMARY OF THE PRESENT INVENTION

It is an aspect of the present invention to provide a new and improved device configuration and manufacturing method for providing a semiconductor power device with improved termination structure with higher breakdown voltage than the core cell in the active area to achieve good unclamped inductive switch (UIS) capability, improved robust and better device reliability.

Another aspect of the present invention is to provide a new and improved device configuration and manufacturing method for providing a semiconductor power device that implements new termination structures to achieve the electrical field spreading through the termination area to prevent the electrical field crowding at the surface thus improving the device reliability.

Specifically, an aspect of the present invention is to provide a new and improved device configuration and manufacturing method for providing a semiconductor power device that implements new termination structures wherein the termination area comprises many duplicated units with each unit having several electrically interconnected trench polysilicon with electrically floating mesa areas between the duplicated units. The floating mesa areas between the duplicated units are provided to spread the electrical field away from the shield oxide on the trench sidewalls thus reducing the electrical field crowding and improving the device reliability.

Briefly in a preferred embodiment this invention discloses a semiconductor power device formed on a semiconductor substrate comprises an active cell area and a termination area disposed near edges of the semiconductor substrate. The termination area comprises a plurality of duplicated units wherein each unit includes at least two trenches filled with a conductive trench material having a mesa area between adjacent trenches wherein the trenches and the mesa areas within each of the duplicated units are electrically shunt together. In the termination area each of the trenches in the duplicated units has a buried guard ring dopant region disposed below a bottom surface of the trenches.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 3A, 3A-1, 3A-2 and 3B are cross sectional views for depicting termination configurations of this invention.

DETAILED DESCRIPTION OF THE PREFERRED EMBODIMENTS

Figure 3A:
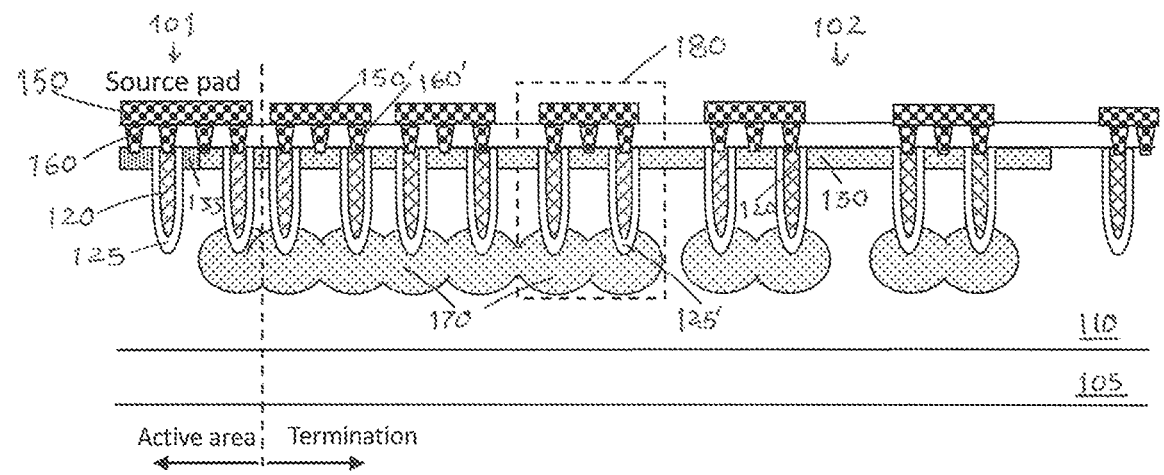

FIG. 3A is a cross section view of a semiconductor power device 100 as a preferred embodiment of this invention. The semiconductor power device 100 includes an active cell area 101 and a termination area 102 and is formed on an N-type semiconductor substrate 105 supporting an N-type epitaxial layer 110 on top of the bottom substrate layer 105. The active cell area 101 comprises a plurality of transistor cells. Each cell includes a trench 120 with polysilicon filling the trenches having sidewall padded with a shield oxide layer 125. Each transistor cell further includes a P-type body region 135 surrounding the trench 120 near the top surface of the N-type epitaxial layer 110. An insulation layer 140 covers over the top surface. The trench contacts 160 penetrate through the insulation layer to contact the P-type body region 135 and the trench 120 to a source metal layer 150 formed and patterned on top of the insulation layer 140.

Figure 1:
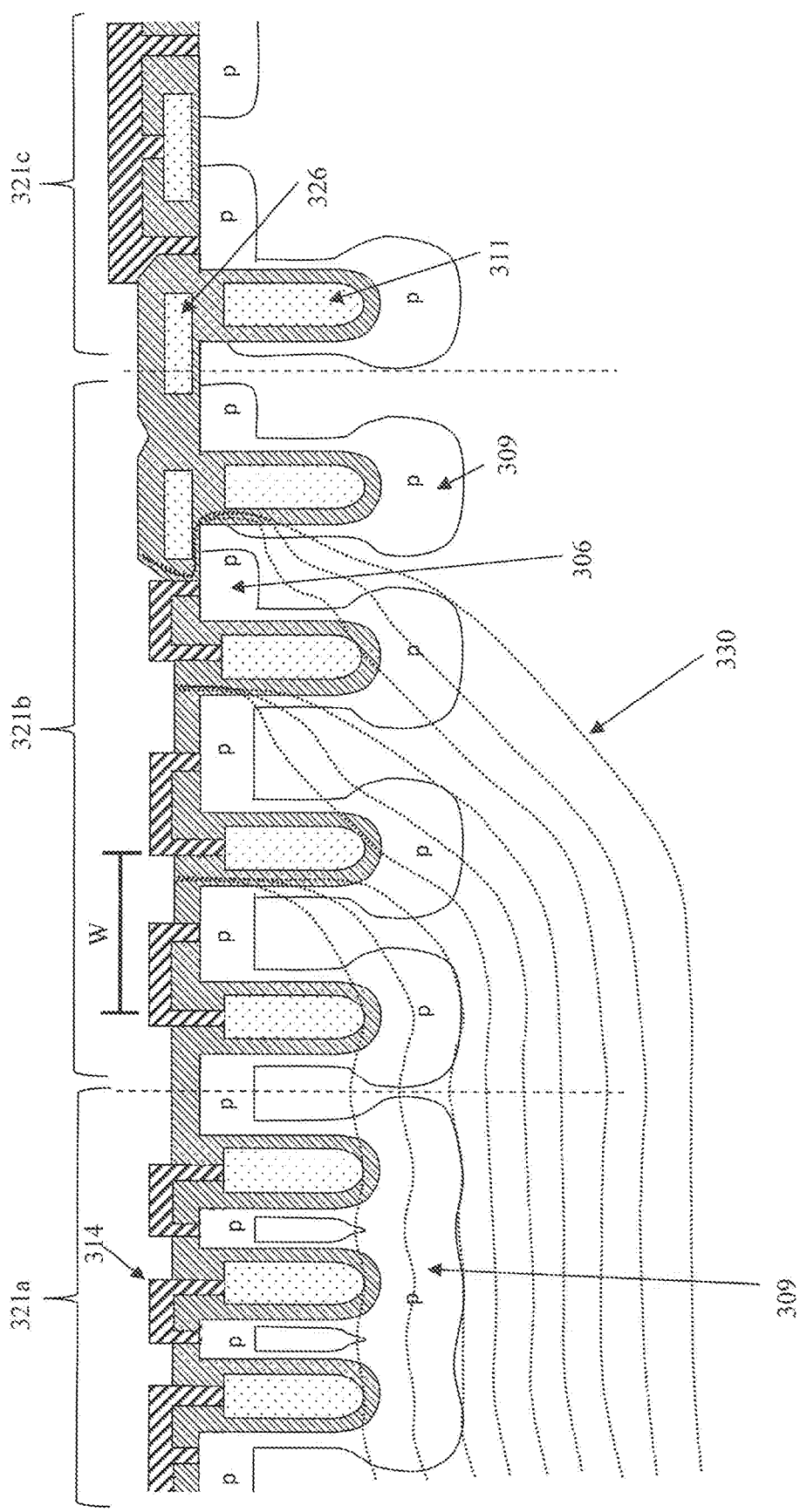
FIGS. 1 and 2A and 2B are cross sectional views showing three different termination configurations of conventional semiconductor power devices.
Figure 2A:
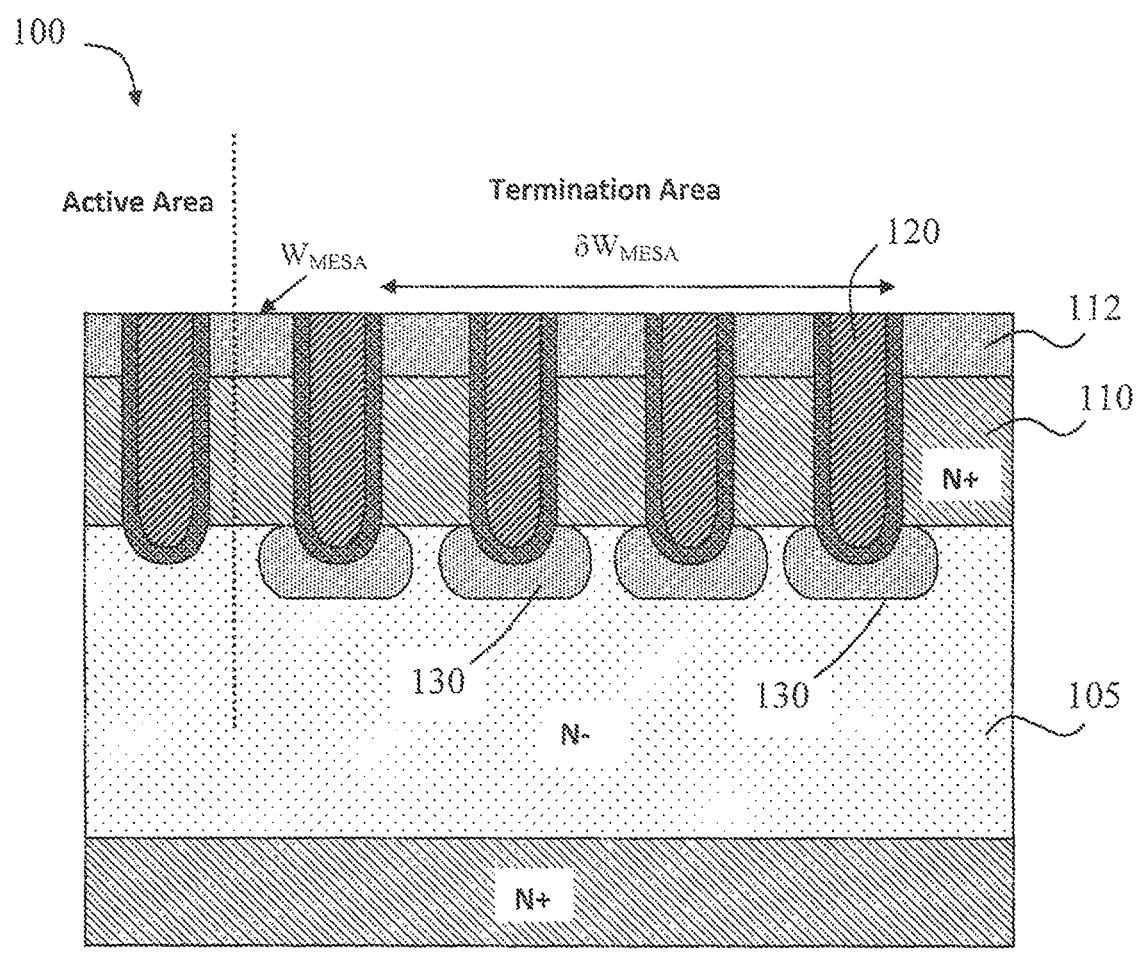
Figure 2B:
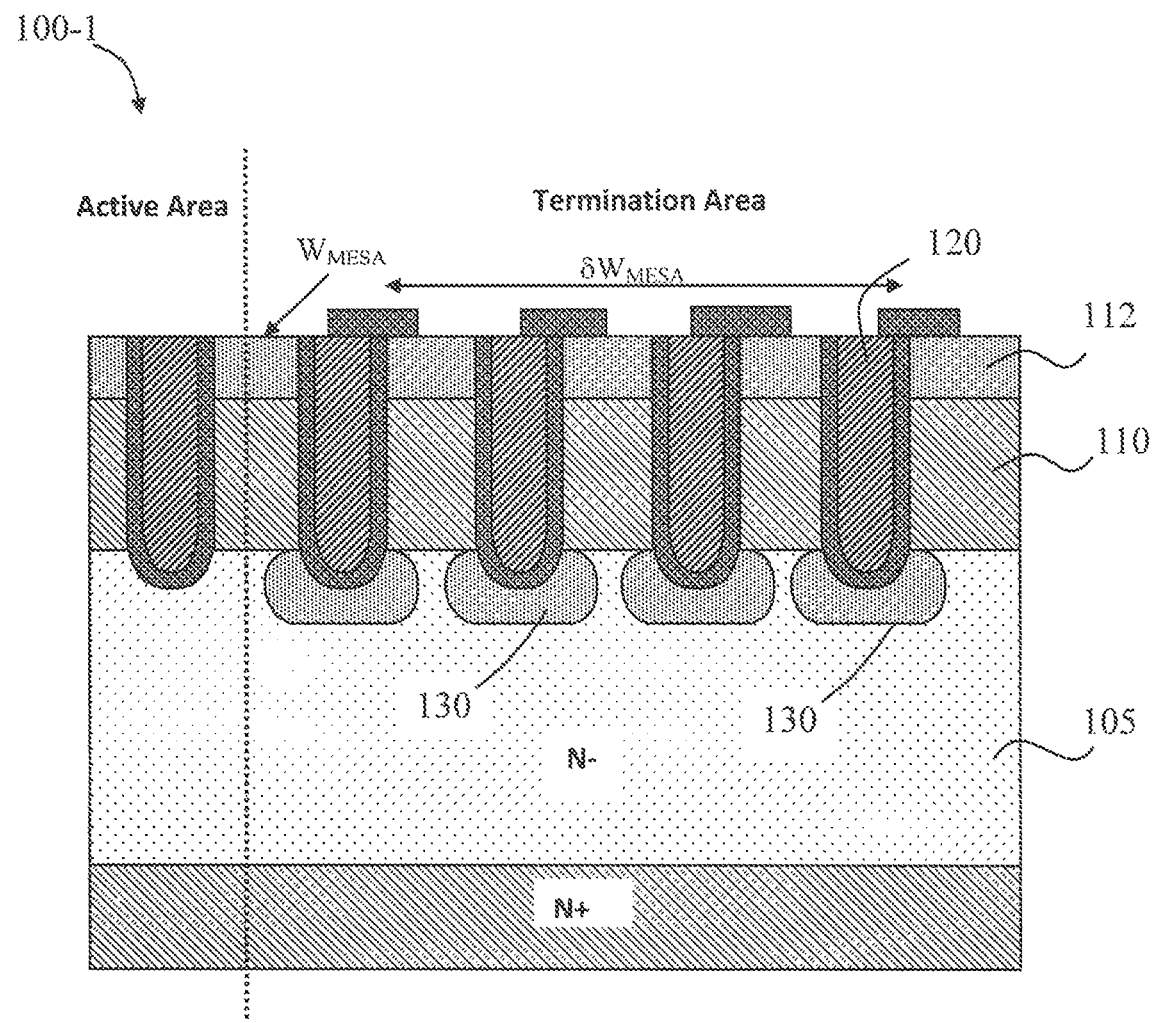

As shown in FIG. 3A, the termination area 102 includes a plurality of duplicated units, such as multiple pairs of two-adjacent trenches 180, wherein each unit comprises at least two termination trenches 120' with trench sidewalls padded with oxide layer 125' and filled with polysilicon. The termination structure of this invention further includes P-type buried guard ring regions 170 formed below the bottom surface of the termination trenches and surrounding the bottom portions of the trench sidewalls. FIG. 3A-1 specifically shows one of the duplicated units in the termination area. The polysilicon in the adjacent termination trenches and the mesa between the trenches are electrically connected by the top metal layer 150'. FIG. 3A-2 shows another duplicated unit that includes three termination trenches 120' having bottom P-doped guard ring 170. The polysilicon in the trenches and the mesa between the trenches are electrically shorted by a top metal layer 150'. Therefore, according to FIGS. 3A, 3A-1 and 3A-2, the termination area has many duplicated units and in each unit, the termination trenches 120' and the mesa area between the trenches are shunted together. Between each unit, the mesa areas between the termination trenches are floating. FIG. 3A further depicts the first mesa area closest to the active cell area 101 has a narrowest width. In contrast to the conventional structures discussed above, because there is no contact, the minimum width of the mesa is not limited by critical dimension (CD) of the contact. Furthermore, since the mesa areas between the units are floating, the electrical field can spread between the shield oxide and the floating mesa thus reducing the electrical field crowding on the shield oxide layer on the sidewalls of the termination trenches.

Figure 3B:
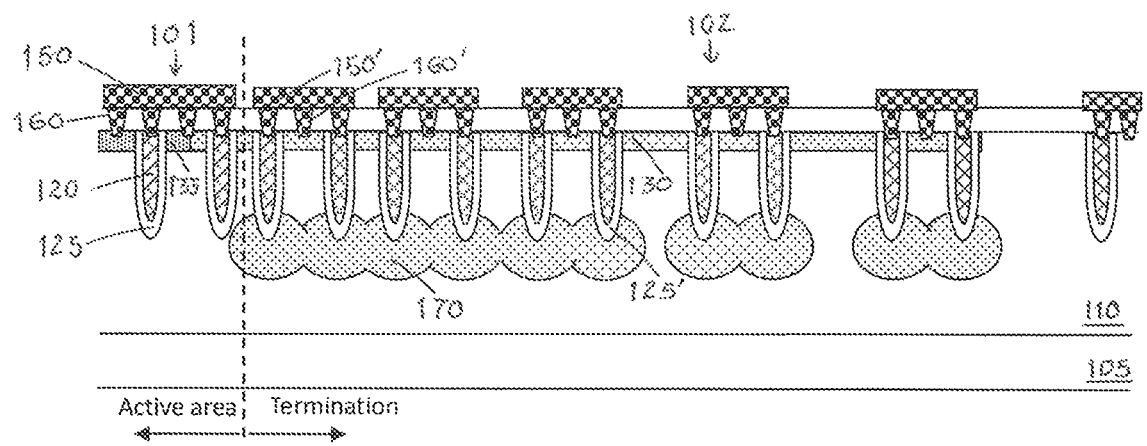
Figures 1, 2, 3A:
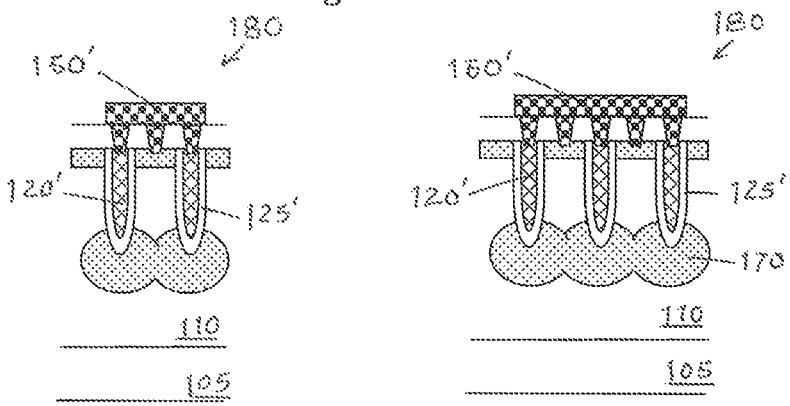

FIG. 3B shows another embodiment having similar termination structure of FIG. 3A. The only difference between the structures of FIGS. 3A and 3B is that the bottom guard ring dopant region 170 is formed below the last trench 120 in the active area in FIG. 3A. In contrast, the last trench 120 in the active area of FIG. 3B does not have a bottom guard ring dopant region below the trench gate 120.

Figure 4A:
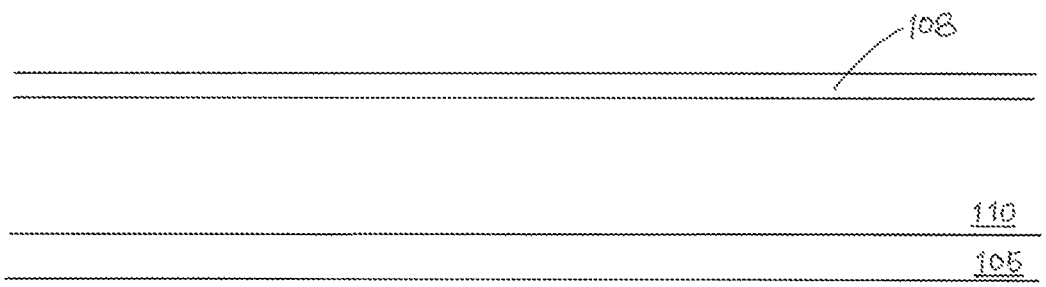
FIGS. 4A to 4I are a series of cross sectional views for illustrating the manufacturing processes of devices shown in FIGS. 3A and 3B.
Figure 4B:
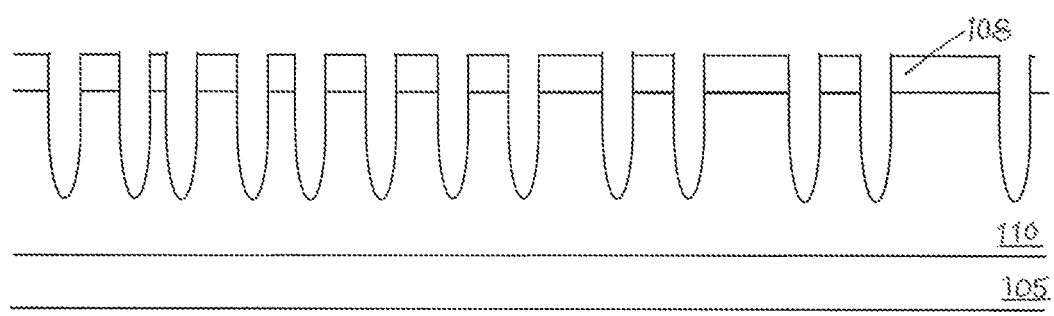
Figure 4C:
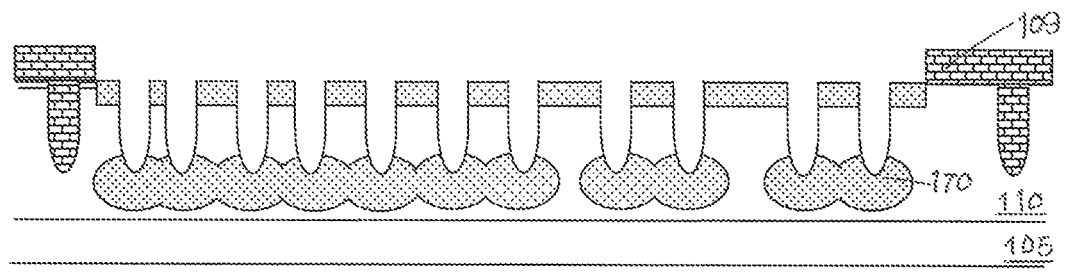

FIGS. 4A-4I are a series of cross sectional views to show the fabrication processes of a semiconductor power device shown in FIGS. 3A to 3B. In FIG. 4A, a hard mask 108 is deposited at first on top of the epitaxial layer 110 supported on the silicon substrate 105. In FIG. 4B, a trench mask (not shown) is applied on top of the hard mask 108 to carry out a trench etch process to open a plurality of trenches in the epitaxial layer 110. In FIG. 4C, the hard mask 108 is removed followed by necessary steps to smooth the trench sidewalls including a sacrificial oxidation and an oxide etch to remove the damaged surface on the trench wall. Then a photolithography process with a photo-resist 109 is carried out to define the buried guard ring (BGR) implant pattern followed by carrying out buried guard ring implant to form buried guard ring regions 170 below the bottom surface of the termination trenches in the termination area and simultaneously form P-type regions 130 at the surface of the mesa.

Figure 4D:
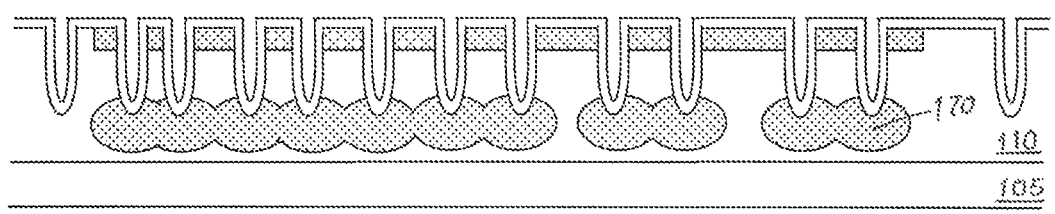
Figure 4E:
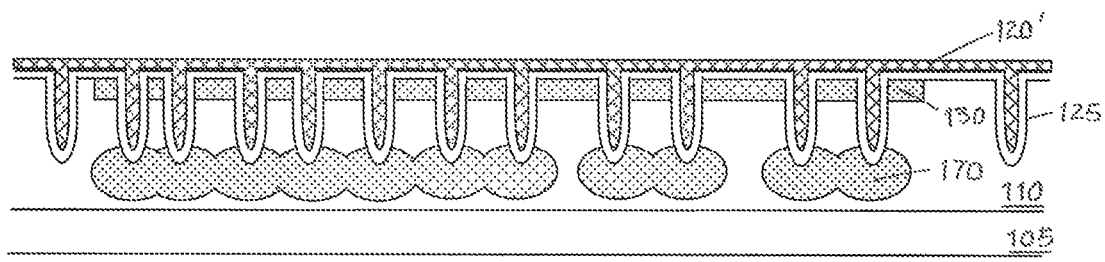
Figure 4F:
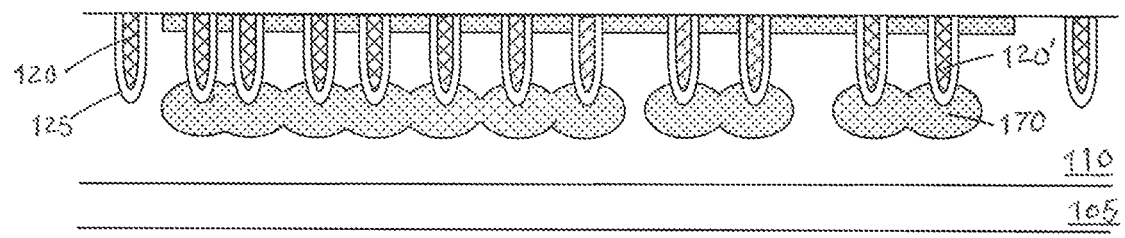
Figure 4G:
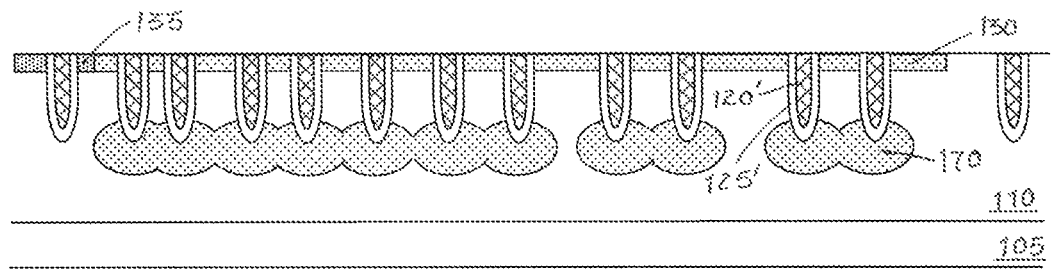

In FIG. 4D, a shield oxide layer 125 is deposited into the trenches. In FIG. 4E, a shield polysilicon deposition process is carried out to deposit polysilicon 120' into trenches 120 and in FIG. 4F, an etch back is performed to etch back the shield polysilicon layer 120 without a mask until the top surface of the shield polysilicon is aligned to the Si surface. In FIG. 4G, processing steps are carried out in the active area including the processes of gate oxide, gate polysilicon, body implant, source implant and drive in with elevated temperature to form the transistor cells in the active cell area 101.

Figure 4H:
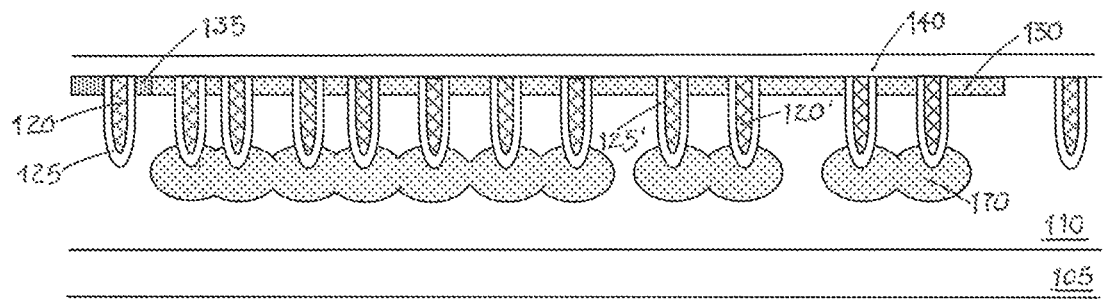
Figure 4I:
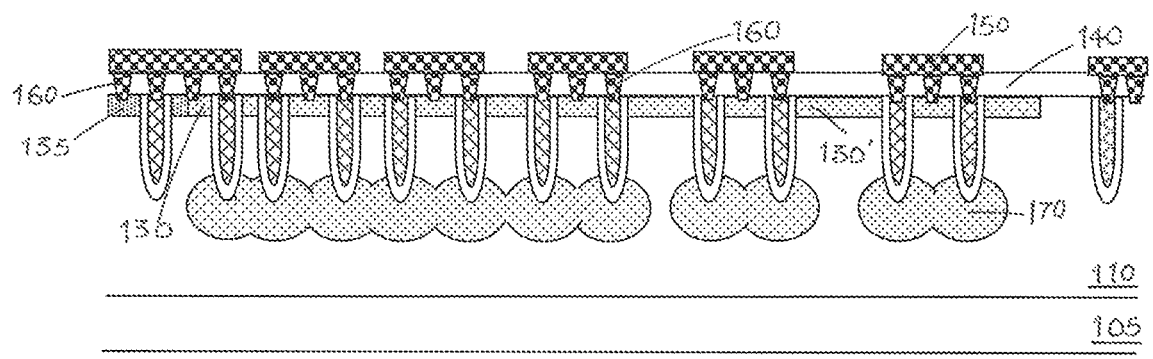

In FIG. 4H, a local thermal oxide (LTO) and BPSG deposition processes are performed to form an insulation layer 140 covering over the top surface of the semiconductor power device. In FIG. 4I, a contact trench etch is performed to open contact trench through the passivation/insulation layer 140 followed by filling the contact trench with tungsten plugs to form trench contacts 160. Then the processes are completed with the deposition and patterning of the top metal layer 150. In the termination area, the top metal layer 150' are formed for contacting the trench contacts 160' that penetrate through the insulation layer 140 to contact the termination trenches 120' and also the mesa areas 130' between the termination trenches 120. In the active cell area, the top source metal 150 are electrically connected to the source regions 130 and source regions 135 through the trench contacts formed as tungsten plugs 160.

Figure 5A:
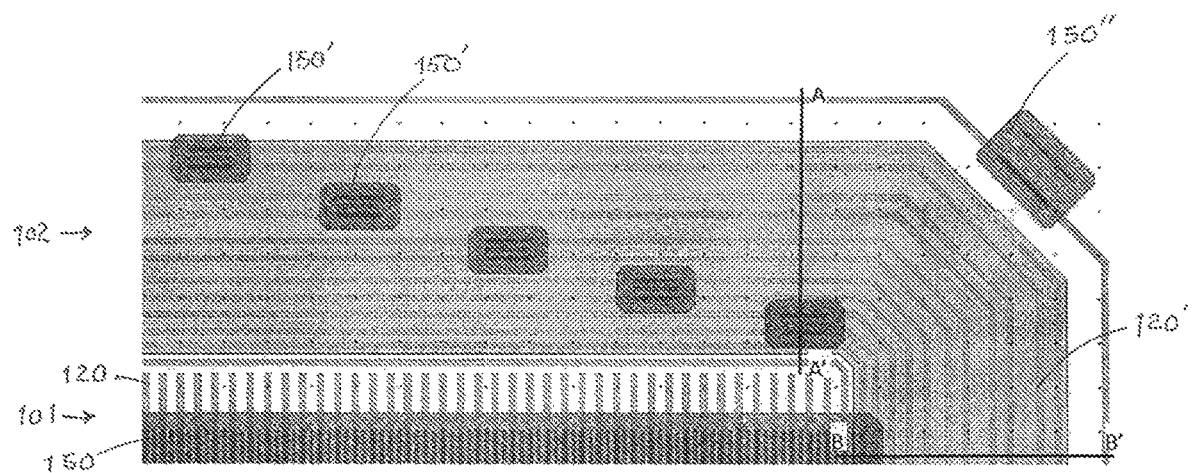
FIG. 5A is a top view of a device of showing the layout of the present invention.
Figure 5B:
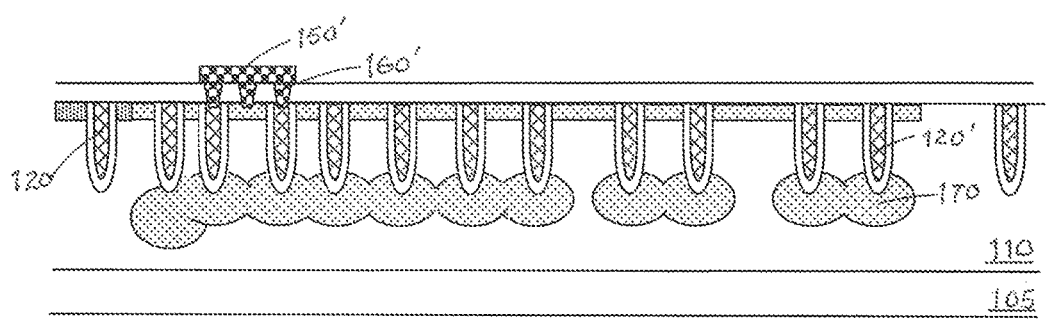
FIGS. 5B and 5C are cross sectional views of the termination region along lines A-A' and B-B' of FIG. 5A.
Figure 5C:
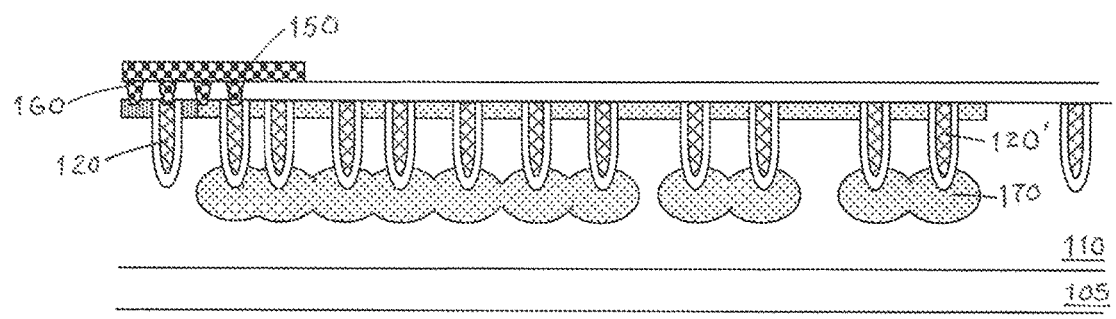

FIG. 5A is a top view of a preferred embodiment of this invention to show a layout configuration of a semiconductor power device. In the layout shown in FIG. 5A and the cross sectional views shown in FIGS. 5B and 5C along cross sections of lines A-A' and B-B' respectively, there are multiple duplicated units linked together by metal pads 150'. Each of these metal pads 150' laterally extends on the top surface over at least two or three terminal trenches. The top metal pads further have trench contacts 160 penetrate through the insulation layer 140 to electrical connect to the trench and the mesa areas between the termination trenches.

Each of these termination trenches further have buried guard ring dopant region disposed below the termination trenches. The termination trenches that are disposed closer to the active cell area are formed with shorter distance between the adjacent trenches and the buried guard ring dopant regions are interconnected. The termination trenches formed as duplicated units that are disposed farther away from the active cell area are formed with longer distance between the adjacent trenches and the buried guard ring dopant regions are interconnected in each of the duplicated units and separated from adjacent duplicated units. On the outer edge of the device, a metal pad 150'' is also formed to function as a channel stop for the power device.

Figure 6:
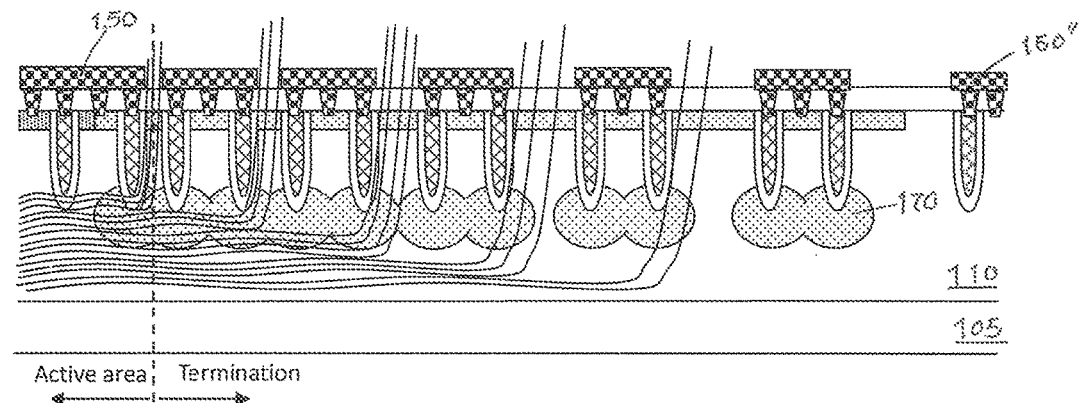
FIG. 6 is a cross sectional view to illustrate the electrical potential distribution across the termination area.

With the termination structures as described above, FIG. 6 shows the electrical potential across the termination area. The electrical potential is distributed near the bottom surface when extending initially outward from the active cell area. The electrical field is guided to extend upwardly toward the top surface between the duplicated units of termination trenches linked by the metal pads 150'. Therefore, the structure of the termination disclosed in this invention totally resolves the problems of electrical field crowding near the sidewall shield oxide. The device reliability is improved and increased device robustness is achieved. Furthermore, the floating mesa area can be flexibly adjusted. Unlike the conventional termination structures described above, a minimum floating mesa is no longer limited by the contact width.

Figure 7:
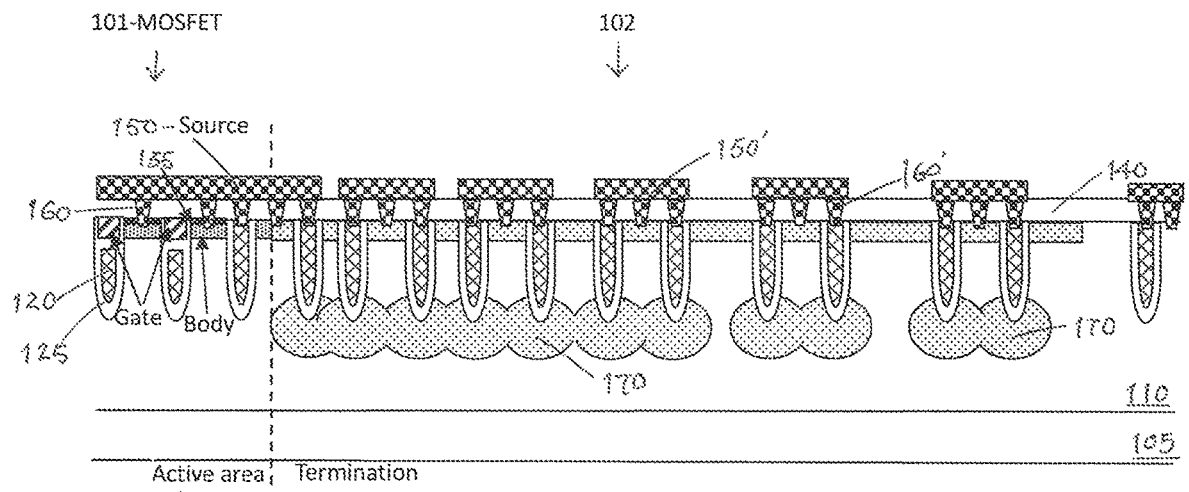
FIG. 7 is a cross section view for showing a MOSFET device implemented with a termination configuration of this invention.

FIG. 7 is a cross section view for showing a MOSFET device implemented with a termination configuration of this invention. The MOSFET includes an active cell area 101-MOSFET and a termination area 102 and is formed on an N-type semiconductor substrate 105 supporting an N-type epitaxial layer 110 on top of the bottom substrate layer 105. The active cell area 101-MOSFET comprises a plurality of MOSFET transistor cells. Each MOSFET cell includes a trench 120 with polysilicon filling the trenches having sidewall padded with a shield oxide layer 125. Each MOSFET transistor cell further includes a P-type body region 130 surrounding the trench 120 with an N-type source region 135 formed near the top surface of the N-type epitaxial layer 110. An insulation layer 140 covers over the top surface. The trench contacts 160 penetrate through the insulation layer to contact the P-type body region 130 and the source regions 135 to a source metal layer 150-Source formed and patterned on top of the insulation layer 140.

Figure 8:
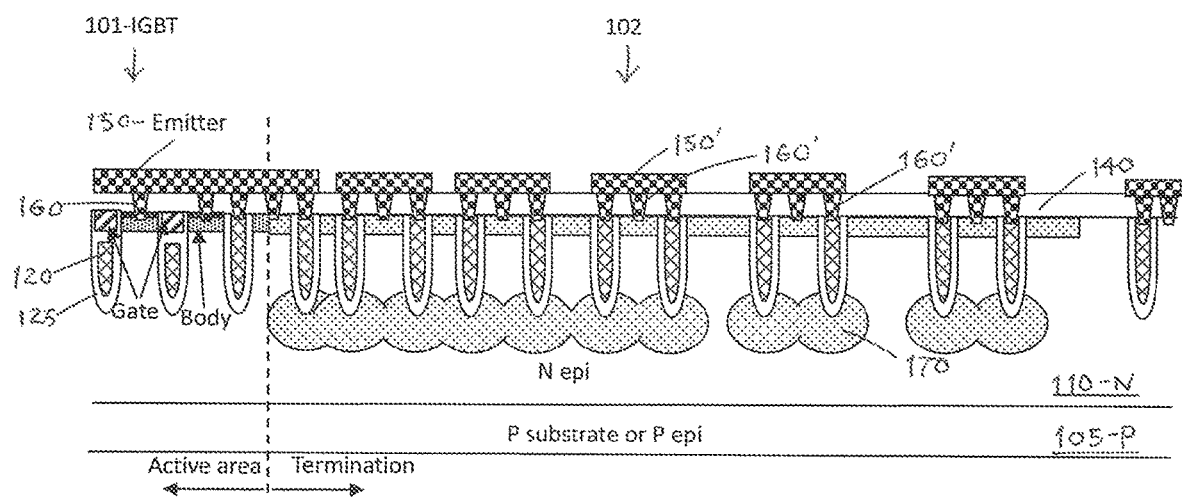
FIG. 8 is a cross section view for showing an IGBT device implemented with a termination configuration of this invention.

FIG. 8 is a cross section view for showing an IGBT device implemented with a termination configuration of this invention. The IGBT includes an active cell area 101-IGBT and a termination area 102 as that shown in FIG. 3A and is formed on a P-type layer 105-P supporting an N-type epitaxial layer 110-N on top of the bottom layer 105-P. The bottom layer 105-P can be a substrate, an epi layer or an implanted P layer. The active cell area 101 comprises a plurality of IGBT transistor cells. Each IGBT cell includes a trench 120 with polysilicon filling the trenches having sidewall padded with a shield oxide layer 125. Each transistor cell further includes a P-type body region 130 surrounding the trench 120 with an N-type source region 135 formed near the top surface of the N-type epitaxial layer 110. An insulation layer 140 covers over the top surface. The trench contacts 160 penetrate through the insulation layer to contact the P-type body region 130 and the trench 120 to an emitter metal layer 150-emitter formed and patterned on top of the insulation layer 140.

Figure 9:
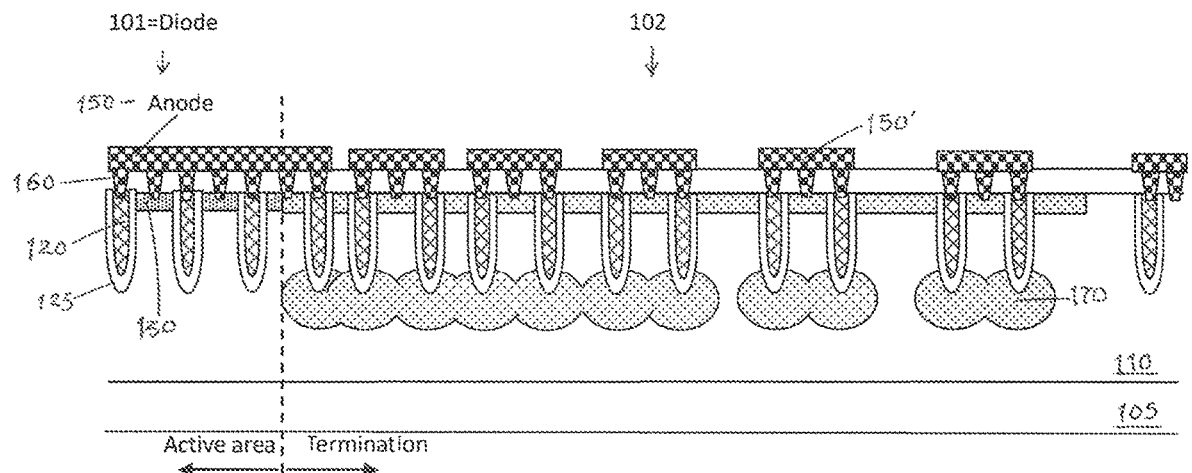
FIG. 9 is a cross section view for showing a diode power device implemented with a termination configuration of this invention.

FIG. 9 is a cross section view for showing a diode device implemented with a termination configuration of this invention. The diode includes an active cell area 101-Diode and a termination area 102 as that shown in FIG. 3A and is formed on an N-type semiconductor substrate 105 supporting an N-type epitaxial layer 110 on top of the bottom substrate layer 105. The active cell area 101-Diode comprises a plurality of diode transistor cells. Each diode cell includes a trench 120 with polysilicon filling the trenches having sidewall padded with a shield oxide layer 125. Each transistor cell further includes a P-type body region 130 surrounding the trench 120 near the top surface of the N-type epitaxial layer 110. An insulation layer 140 covers over the top surface. The trench contacts 160 penetrate through the insulation layer to contact the P-type body region 130 and the trench 120 to an anode metal layer 150-anode formed and patterned on top of the insulation layer 140.

Figure 10:
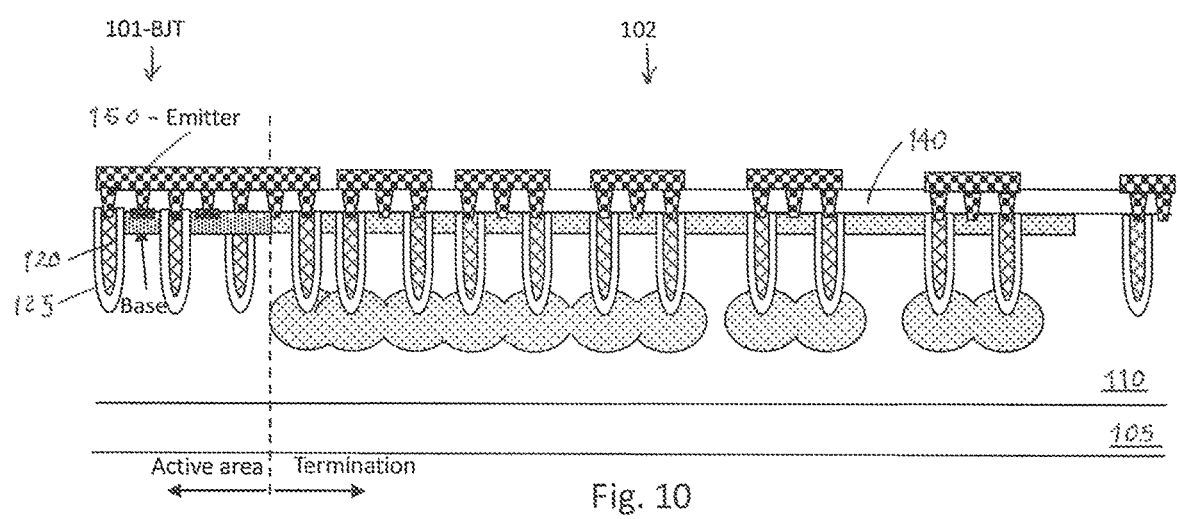
FIG. 10 is a cross section view for showing a thyrister power device implemented with a termination configuration of this invention.

FIG. 10 is a cross section view for showing a bipolar junction transistor (BJT) device implemented with a termination configuration of this invention. The BJT device includes an active cell area 101-BJT and a termination area 102 as that shown in FIG. 3A and is formed on an N-type semiconductor substrate 105 supporting an N-type epitaxial layer 110 on top of the bottom substrate layer 105. The active cell area 101-BJT comprises a plurality of BJT transistor cells. Each BJT cell includes a trench 120 with polysilicon filling the trenches having sidewall padded with a shield oxide layer 125. Each BJT transistor cell further includes a P-type base region 130-Base surrounding the trench 120 near the top surface of the N-type epitaxial layer 110. An insulation layer 140 covers over the top surface. The trench contacts 160 penetrate through the insulation layer to contact the P-type body region 130 through a doped contact area 135' and also contact the trench 120. The trench contacts also contact an emitter metal layer 150-Emitter formed and patterned on top of the insulation layer 140.

Figure 11:
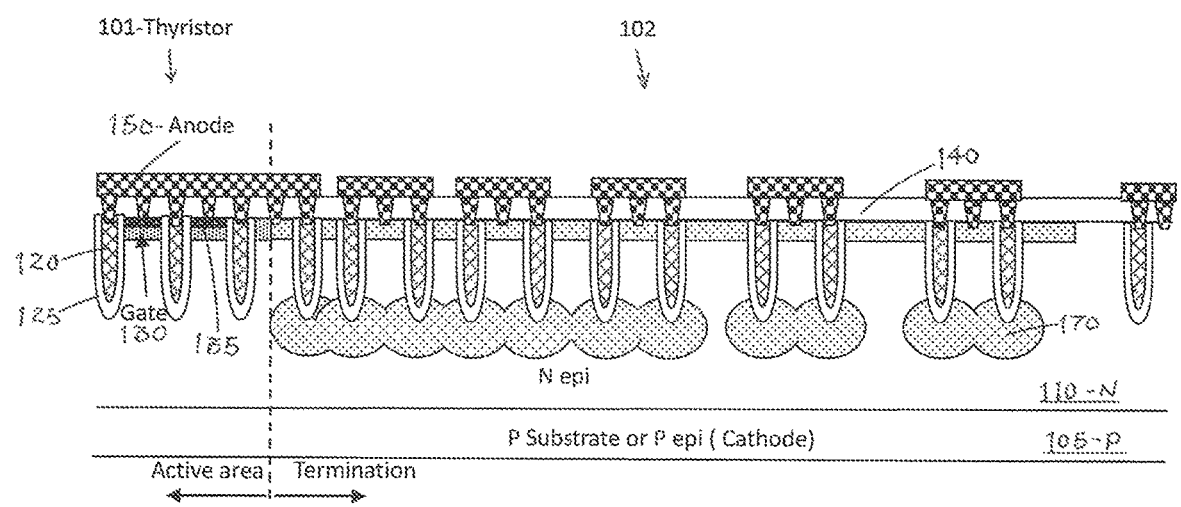
FIG. 11 is a cross section view for showing a BJT power device implemented with a termination configuration of this invention.

FIG. 11 is a cross section view for showing a thyristor device implemented with a termination configuration of this invention. The thyristor device includes an active cell area 101-Thyristor and a termination area 102 as that shown in FIG. 3A and is formed on an P-type semiconductor substrate 105-P supporting an N-type epitaxial layer 110 on top of the bottom substrate layer 105. The active cell area 101-Thyristor comprises a plurality of thyristor transistor cells. Each thyristor cell includes a trench 120 with polysilicon filling the trenches having sidewall padded with a shield oxide layer 125. Each thyristor transistor cell further includes a P-type gate region 130-Gate surrounding the trench 120 near the top surface of the N-type epitaxial layer 110. An insulation layer 140 covers over the top surface. The trench contacts 160 penetrate through the insulation layer to contact the P-type body region 130 through a doped contact area 135' and also contact the trench 120. The trench contacts also contact an anode metal layer 150-Anode formed and patterned on top of the insulation layer 140.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device formed in a semiconductor substrate comprises:
   an active cell area and a termination area disposed near edges of the semiconductor substrate wherein:
   the termination area comprises a plurality of pairs of two adjacent trenches wherein each trench is filled with a conductive trench material and padded with a gate insulation layer and wherein each trench extends downwardly into an epitaxial layer of a first conductivity type through a top dopant layer of a second conductivity type with an entire top surface covered by a top insulation layer;
   each of the pairs of the two adjacent trenches further includes a metal plate disposed on top of the top insulation layer and wherein each of the pairs further includes two outer and a middle contact trenches opened through the top insulation layer filled with a trench contact metal wherein the two outer contact trenches filled with the contact metal contact and connect the metal plate to the two adjacent trenches of each of the pairs and the middle contact trench filled with the contact metal contacts and connects a region of the top dopant layer of the second conductivity type between the two adjacent trenches of each of the pairs of the two adjacent trenches; and
   at least one of the pairs of the two adjacent trenches, constitutes a first interconnected trench pair, further has two interconnected buried guard ring dopant regions of the second conductivity type disposed below a bottom surface of the pairs of the two adjacent trenches and wherein the two interconnected buried guard ring dopant regions are separated from other buried guard ring dopant regions of the second conductivity type disposed below the bottom surface of other trenches in the termination area.

2. The semiconductor power device of claim 1 wherein:
   at least a second pair of the pairs of the two adjacent trenches, constitutes a second interconnected trench pair, further has two interconnected buried guard ring dopant regions of the second conductivity type disposed below a bottom surface of the second pair of the two adjacent trenches and wherein the two interconnected buried guard ring dopant regions under the second pair of trenches are separated from other buried guard ring dopant regions of the second conductivity type disposed below the bottom surface of other trenches in the termination area.

3. The semiconductor power device of claim 1 wherein:
   a distance between the pairs of the two adjacent trenches is shorter between the pairs near the active cell area and larger between the pairs further away from the active cell area.

4. The semiconductor power device of claim 1 wherein:
   regions between the two adjacent trenches of each pair of the two adjacent trenches are electrically insulated by the gate insulation layer from the conductive trench material in the trenches.

5. The semiconductor power device of claim 1 wherein the termination area further comprises a triple interconnected-trench comprising three adjacent trenches, wherein each trench of the three adjacent trenches is filled with the conductive trench material and padded with the gate insulation layer and wherein each trench of the three adjacent trenches extends downwardly into the epitaxial layer of the first conductivity type through the top dopant layer of the second conductivity type with the entire top surface covered by the top insulation layer;
   the triple interconnected-trench further includes a metal plate disposed on top of the top insulation layer and further includes sequentially, first, second, third, fourth, and fifth contact trenches opened through the top insulation layer and filled with a trench contact metal, wherein the first, the third and the fifth contact trenches filled with the contact metal contact and connect the metal plate to the three adjacent trenches of the triple interconnect trench and the second and the fourth contact trenches filled with the contact metal contacts and connects the region of the top layer of the second conductivity type between the three adjacent trenches; and
   a triple interconnected buried guard ring dopant region of the second conductivity type disposed below a bottom surface of the three adjacent trenches and wherein the triple interconnected buried guard ring dopant regions are separated from other buried guard ring dopant regions of the second conductivity type disposed below the bottom surface of other trenches in the termination area.

6. The semiconductor power device of claim 2 wherein:
   the active cell area further comprises an outmost trench immediately adjacent to the terminal area wherein the outmost trench is filled with the conductive trench material and wherein the buried guard ring dopant region below the bottom surface of the trenches in the termination area is terminated before extending to an area below a bottom surface of the outmost trench.

7. The semiconductor power device of claim 1 wherein:
   the active cell area further comprises an outmost trench immediately adjacent to the terminal area wherein the outmost trench is filled with the conductive trench material; and
   a buried guard ring dopant region disposed below the bottom surface of the outmost trench and the buried guard ring dopant region are linked together with the buried guard ring dopant region disposed below a bottom surface of the trenches of one of the plurality of pairs of the two adjacent trenches disposed in the termination area immediately adjacent to the active cell area.

8. The semiconductor power device of claim 1 further comprising:
   a metal oxide semiconductor field effect transistor (MOSFET) power device disposed in the active cell area of the semiconductor substrate.

9. The semiconductor power device of claim 1 further comprising:
   an insulated gate bipolar transistor (IGBT) power device.

10. The semiconductor power device of claim 1 further comprising:
    a diode power device.

11. The semiconductor power device of claim 1 further comprising:
    a thyristor power device.

12. The semiconductor power device of claim 1 further comprising:
    a bipolar junction transistor (BJT) power device.

* * * * *